(12) United States Patent
Roath et al.

(10) Patent No.: US 7,316,579 B2
(45) Date of Patent: Jan. 8, 2008

(54) ZERO INSERTION FORCE CABLE INTERFACE

(75) Inventors: Alan L. Roath, Madison, OH (US); John T. Venaleck, Painesville, OH (US)

(73) Assignee: Ohio Associated Enterprises, LLC, Painesville, OH (US)

( * ) Notice: Subject to any disclaimer, the term of this patent is extended or adjusted under 35 U.S.C. 154(b) by 0 days.

(21) Appl. No.: 11/522,685

(22) Filed: Sep. 18, 2006

(65) Prior Publication Data

US 2007/0066114 A1 Mar. 22, 2007

Related U.S. Application Data

(60) Provisional application No. 60/717,646, filed on Sep. 16, 2005.

(51) Int. Cl.
*H01R 13/15* (2006.01)
(52) U.S. Cl. ............... 439/260; 439/265; 439/267; 439/268
(58) Field of Classification Search ........... 439/260, 439/265, 268, 267
See application file for complete search history.

(56) References Cited

U.S. PATENT DOCUMENTS

| | | | |
|---|---|---|---|
| 3,818,419 A | 6/1974 | Crane | |
| 3,828,301 A | 8/1974 | Neidecker | |
| 4,077,688 A | 3/1978 | Cobaugh et al. | |
| 4,178,053 A | 12/1979 | Eifort | |
| 4,179,176 A * | 12/1979 | Jayne | 439/267 |
| 4,188,086 A | 2/1980 | Inouye et al. | |
| 4,367,006 A | 1/1983 | Rehbogen, Jr. et al. | |
| 4,392,705 A | 7/1983 | Andrews, Jr. et al. | |
| 4,944,690 A | 7/1990 | Imai | |
| 5,795,171 A * | 8/1998 | Bernardini | 439/260 |
| 5,795,172 A | 8/1998 | Shahriari et al. | |
| 5,808,474 A | 9/1998 | Hively et al. | |
| 5,821,764 A | 10/1998 | Slocum et al. | |
| 5,945,837 A | 8/1999 | Fredrickson | |
| 6,316,954 B1 | 11/2001 | Venaleck et al. | |
| 6,356,449 B1 | 3/2002 | Sasaki et al. | |
| 6,679,714 B2 | 1/2004 | Kimura | |
| 6,824,410 B1 | 11/2004 | Co et al. | |
| 6,979,216 B2 | 12/2005 | Maeda et al. | |
| 2002/0028588 A1 | 3/2002 | Watanabe et al. | |
| 2006/0014417 A1 | 1/2006 | Crofoot et al. | |

FOREIGN PATENT DOCUMENTS

JP 3-59977 * 3/1981

* cited by examiner

*Primary Examiner*—Tho D. Ta
(74) *Attorney, Agent, or Firm*—Renner, Otto, Boisselle & Sklar, LLP

(57) ABSTRACT

An electrical connector includes a cable end connector which mates with a board mount connector. The cable end connector includes a plurality of header modules that each include pivotal contact-bearing headers. The headers are coupled to ribbon conductors in a parallel planar array. One end of each of the headers has conductors prepared to accept the welding of ribbonized coaxial cables. The other end of the conductors form compliant contacts for engagement with other compliant contacts or with pads arranged on the edge of a circuit board. Headers of each module have posts that emanate from lateral sides of a header body, distal from the compliant contact ends, that function as cam sliders. The cam sliders are located in slots, and engage ramps, which may be moved to urge the contacts of the headers together or apart.

18 Claims, 9 Drawing Sheets

ZERO INSERTION FORCE CABLE INTERFACE

This application claims the benefit under 35 USC 119 of U.S. Provisional Application No. 60/717,646, filed Sep. 16, 2005, which is herein incorporated by reference in its entirety.

BACKGROUND OF THE INVENTION

1. Field of the Invention

This invention relates to the termination of transmission line cables and other cables to circuit boards in a tightly spaced matrix and with little or no force of engagement or disengagement.

2. Description of the Related Art

In the field of electronic component testing, it is desirable to simultaneously probe large numbers of separate connections. The electrical signals at these probe points are then transmitted through flexible transmission line cables to a computer port for analysis. The existence of large numbers of these probe positions dictate close spacing and low forces in order to limit the physical size and the amount of force required to make the connection. For example, 60,000 probe positions with conventional connection schemes yield force requirements of 10,000 pounds or more.

An example of a prior art device for use as a test interface may be found in U.S. Pat. No. 6,316,954, which is owned by the assignee of this application, and which is hereby incorporated by reference in its entirety.

There is a continuing need for improved methods of making connections with a tester, so as to limit or reduce the size of the tester and/or the forces required for electrical coupling.

SUMMARY OF THE INVENTION

According to an aspect of the invention, a cable end connector utilizes oval pistons for allowing compressed air (or another compressed gas) to be used to selectively retract contact ends of electrical contacts.

According to another aspect of the invention, a cable end connector includes multiple pivoting headers, each containing an array of conductors.

According to yet another aspect of the invention, a pivot pin for a pivoting header module is located in an elongate pivot pin hole, allowing some amount of self centering.

According to still another aspect of the invention, ramps for use in selective separation of contacts of pivotal modules are ganged together, and are powered by common pressurized gas cylinders, to thereby allow them to be actuated simultaneously. The pressurized gas cylinders may have oval shapes in order to fit in more compact spaces.

According to a further aspect of the invention, cable end connectors may be coupled to mounting structures with screws that pass through oversized holes, either round holes or holes having other suitable shapes, to allow for lateral alignment freedom on the mountings, which may facilitate coupling of the cable end connector to a corresponding connector.

According to a still further aspect of the invention, an electrical connector includes: a back shell; a plurality of contact modules in the back shell, wherein each of the modules has a pair of portions that include respective substantially planar arrays of conductive contacts within insulating material headers; and an actuating system operatively coupled to the contact modules to cause the portions to pivot relative to one another, to thereby selectively bring together or separate contact ends of the contacts.

According to another aspect of the invention, a method of coupling first and second connectors, includes the steps of: separating first contact ends of each of a plurality of first modules of the first connector; inserting a portion of the first connector into the second connector such that second contacts of each of plural second modules of the second connector are between, but not in contact with, the first contact ends of respective of the first modules; and bringing the first contact ends of each of the first modules toward each other such that the first contact ends make contact with the second contacts of respective of the second modules.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF THE DRAWINGS

In the annexed drawings, which are not necessarily to scale.

DETAILED DESCRIPTION

An electrical connector includes a cable end connector which mates with a board mount connector. The cable end connector includes a plurality of header modules that each include pivotal contact-bearing headers. The headers are coupled to ribbon conductors in a parallel planar array. One end of each of the headers has conductors prepared to accept the welding of ribbonized coaxial cables. The other end of the conductors form compliant contacts for engagement with other compliant contacts or with pads arranged on the edge of a circuit board. Headers of each module are able to pivot about a pivot pin in order to move the compliant contacts of the headers towards each other or away from each other. Each header has posts that emanate from lateral sides of a header body, distal from the compliant contact ends, that function as cam sliders. The cam sliders are located in slots, and engage ramps, which may be moved to urge the contacts of the headers together or apart. The ramps may be driven by gas pressure that acts on oval pistons. The oval pistons are single acting and have a return spring with enough force to urge the compliant contacts into engagement. Thus the gas pressure is used to release the engagement of the compliant contacts of the cable end connector and the board mount connector, and the spring supplies the engagement force.

Figure 1:
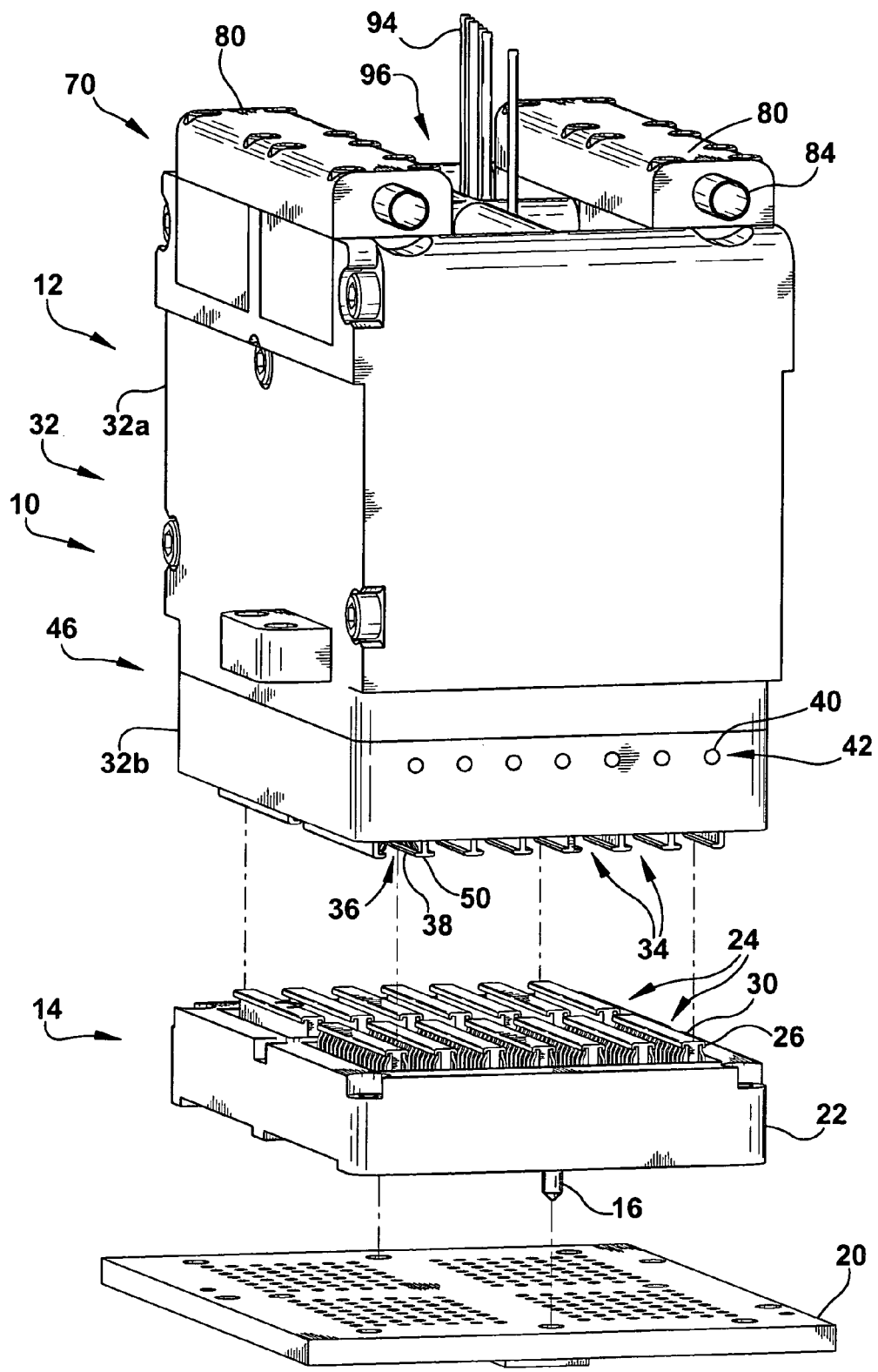
FIG. 1 is an exploded view of an electrical connector in accordance with the present invention.

Referring now to FIG. 1, an electrical connector 10 includes a cable end connector 12 and a board mount connector 14. The board mount connector 14 includes a pin 16 for aligning the board mount connector 14 to a circuit board.

The board mount connector 14 includes a body 22 that contains a plurality of fixed contact modules 24, each of which includes a plurality of contacts 26. The contacts 26 may be compliant contacts matable with other contacts having a similar shape. An example of such contacts is discussed in U.S. Pat. No. 6,371,773, owned by the assignee of this application. This patent is herein incorporated by reference in its entirety.

The board mount connector 14 has an array of connector guards 30 for preventing contact with the tips of the contacts 26. The contact guards 30 prevent damage to the contacts 26 of the contact modules 24, during mating together of the cable end connector 12 and the board mount connector 14. The contact guards 30 may be formed out of a suitable material (the same material as the body 22), such as a suitable plastic.

Figure 2:
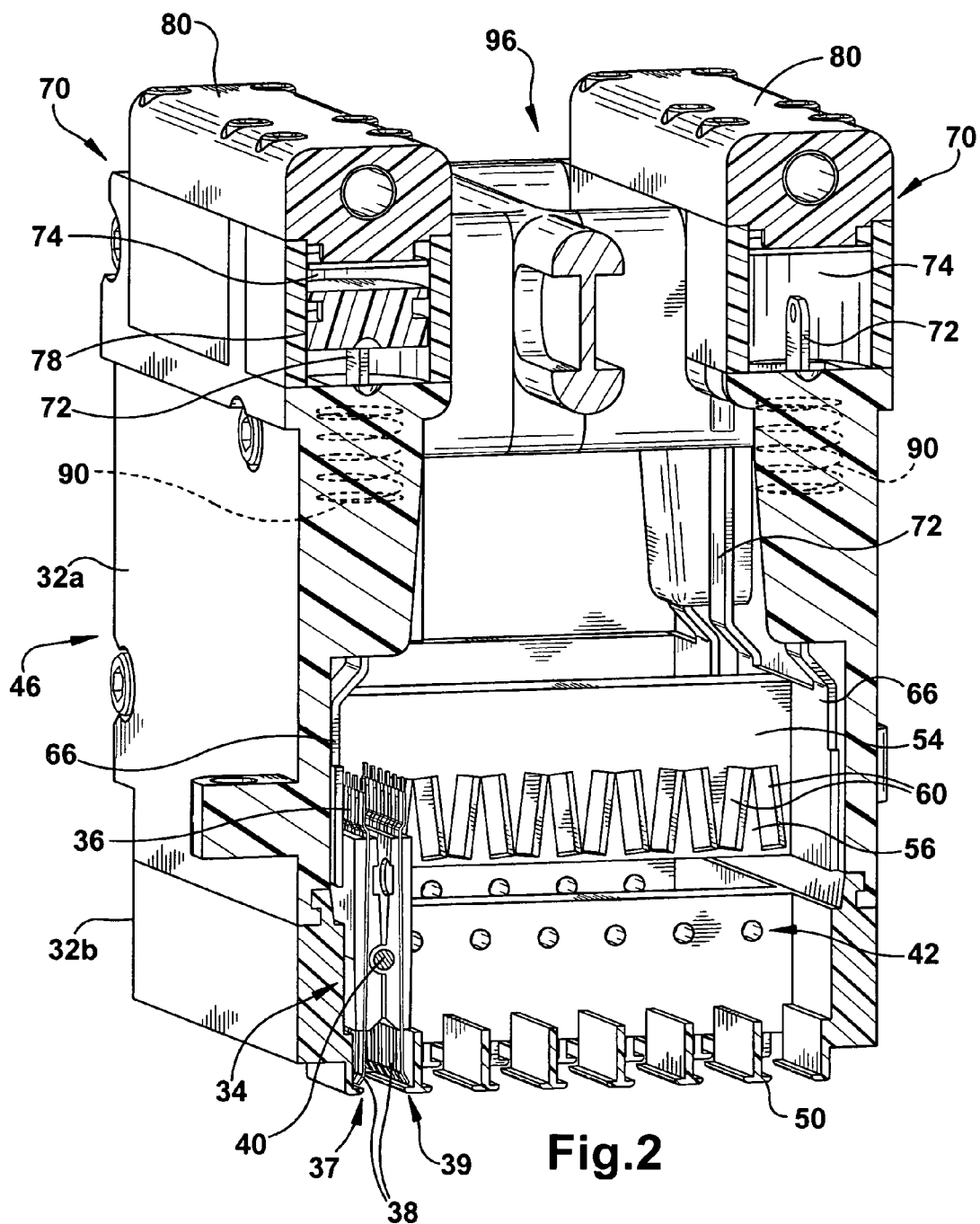
FIG. 2 is a cutaway oblique view showing internal details of a cable end connector that is part of the electrical connector of FIG. 1.

Referring now in addition to FIG. 2, the cable end connector 12 includes a back shell 32 that encloses a plurality of pivotal header modules 34. The back shell 32 includes an upper portion 32a and a lower portion 32b. The back shell portions 32a and 32b may be made of a suitable plastic, and may be mechanically coupled together by any of a variety of suitable methods. Each of the pivotal header modules 34 includes contacts 36 in a pair of planar arrays. The planar arrays of the contacts 36 may be pivoted relative to one another in order to selectively move contact ends 38 of one array 37 toward or away from the contact ends 38 of the other array 39. The contact ends 38 may be compliant ends having a configuration similar to that of the contacts 26 of the board mount connector 14 (FIG. 1).

The parts of the pivotal header modules 34 pivot relative to one another about pivot pins 40. The pivot pins 40 are located in pivot pin holes 42 in the back shell 32. Once the cable end connector 12 and the board mount connector 14 are mated together, the headers pivot to bring the contact ends 38 of the arrays 37 and 39 together, into contact with the contacts 26 of the board mount connector 14. To disengage the cable end connector 12 from the board mount connector 14, an actuating system 46 may be actuated to bring the contact ends 38 of the arrays 37 and 39 away from each other, and thus away from the contacts 26 of the board mount connector 14. Then the cable end connector 12 may be disengaged from the board mount connector 14. When the contact ends 38 are in a retracted position, with the contact ends 38 of one of the planar arrays 37 away from the contact ends of the other planar array 39, the contact ends 38 may be protected from damage by plastic contact guards 50 that are part of the back shell 32. Contact guards 50 may be plastic T-shaped portions that guard the tips of the contact ends 38.

The actuating system 46 includes a series of ramp blocks 54 that have ramps 56 and slots 60 that engage corresponding parts of the pivotal header modules 34. As explained in greater detail below, the ramp blocks 54 are attached to rails 66, at either end of each of the ramp blocks 54. The rails 66 are coupled to compressed pressurized gas actuators 70. The rails 66 have protrusions 72 that protrude into cavities 74 in the back shell 32. There the protrusions 72 are connected to oval pistons 78.

The phrase "oval pistons," as used herein, refers to pistons having a rounded, non-circular cross section shape consisting of two tangent radii. Typical pistons are round, as found in engines and pressurized gas cylinders. Oval pistons are utilized to maximize the surface area of the piston in the space available. In the illustrated embodiment, the oval pistons 78 have a cross section that is an approximate ellipse. The radii at the ends of the major axis of the ellipse are larger than a standard ellipse in order to improve the fit of the "O" ring, so that it conforms to the radius in the bottom of the "O" ring groove, and does not tend to "balloon" out. This larger radius at the end of the major axis also increases the surface area over a standard ellipse with the same major and minor axis lengths. By varying the size of this radius, the perimeter can be increased in order to ensure the proper fit of a standard size "O" ring without increasing the length of the major axis. The radius at the end of the minor axis is designed tangent to the end radii, and passing through a point at the end of the minor axis.

Pistons with a circular cross section are a possible alternative to the above-described oval pistons.

A pressurized gas, such as compressed air, may be introduced into the cavities 74 through manifolds 80 having pressurized gas inlet tubes 84. Introducing pressurized gas into the cavities 74, on one side of the oval pistons 78, causes the oval pistons 78 to move downward. The movement of the oval pistons 78 downward causes the rails 66 to move downward as well, also moving the attached ramp blocks 54 downward. This causes the contact ends 38 to retract, putting them out of engagement with the contacts 26 of the board mount connector 14, and bringing the contact ends 38 within the protection of the contact guards 50. When the pressurized gas in the manifolds 80 and the cavities 74 is released, the pistons 78, the rails 66, and the ramp blocks 54 move upward under the action of a set of springs 90. The cable end connector 12 is thus spring biased such that the contact ends 38 of the pivot header modules are extended (configured to engage the contacts 26 of the board mount connector 14) when no external forces are placed on the actuating system 46. The pivotal feature of the modules 34 allows engagement of the contact ends 38 and the contacts 26 of the board mount connector 12 (FIG. 1) with substantially balanced forces.

The ramps 56 may be substantially linear ramps, having a substantial wedge shape. Alternatively, it will be appreciated that the ramps 56 may have other, non-linear shapes.

Cables 94 (FIG. 1) are inserted through openings 96 in a back end of the back shell 32. Cables 94 engage the pivotal header modules 34, as will be described in greater detail later.

Figure 3:
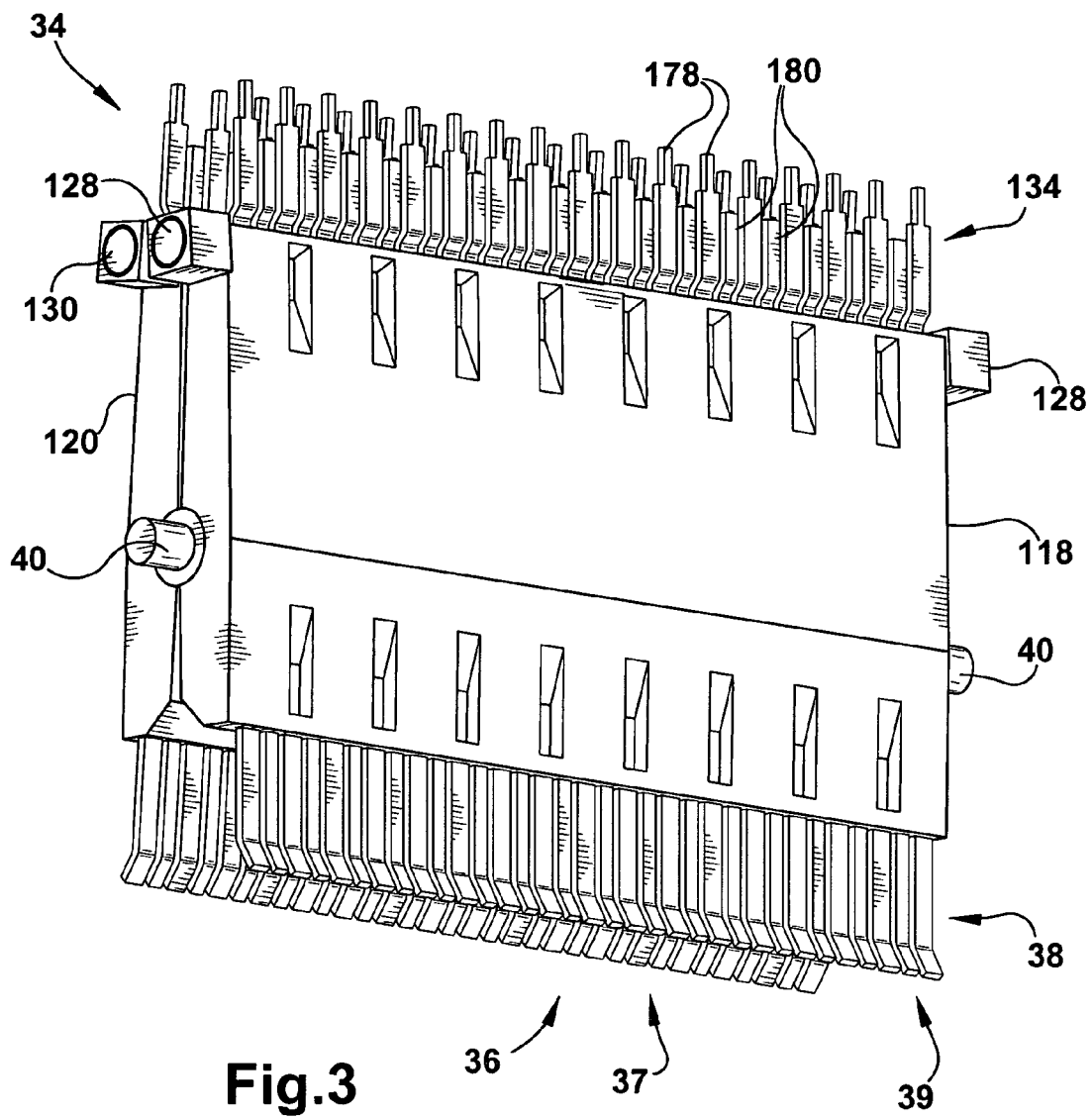
FIG. 3 is an oblique view of a pivotal header module used in the cable end connector of FIG. 2.

With reference now to FIG. 3, further details of the pivotal header 34 are described. The contacts 36 of the headers 34 are arrayed in the pair of planar arrays 37 and 39. The arrays 37 and 39 are held together by respective plastic headers 118 and 120, which may be overmolded onto the arrays 37 and 39 of the contacts 36. The headers 118 and 120 are pivotally mounted relative to one another at a pivot pin 40. The pivot pin 40 passes through the headers 118 and 120 to pivotally couple the headers to each other. Distal from the compliant contact ends 38, the headers 118 and 120 have protruding pairs of cam sliders 128 and 130. The cam sliders 128 and 130 are configured to engage the slots 60 of the ramp blocks 54 (FIG. 2). Movement of the ramp blocks 54 causes the ramps 56 to move the cam sliders 128 either away or towards the cam sliders 130 (depending upon the direction of movement of the ramp blocks 54). This causes the headers 118 and 120 to pivot relative to one other along the pivot pin 40. Thus the compliant contact ends 38 of the arrays 37 and 39 may be selectively brought together or moved apart. The contacts 36 have cable-receiving contact ends 134 at opposite ends from the compliant contact ends 38.

Figure 4:
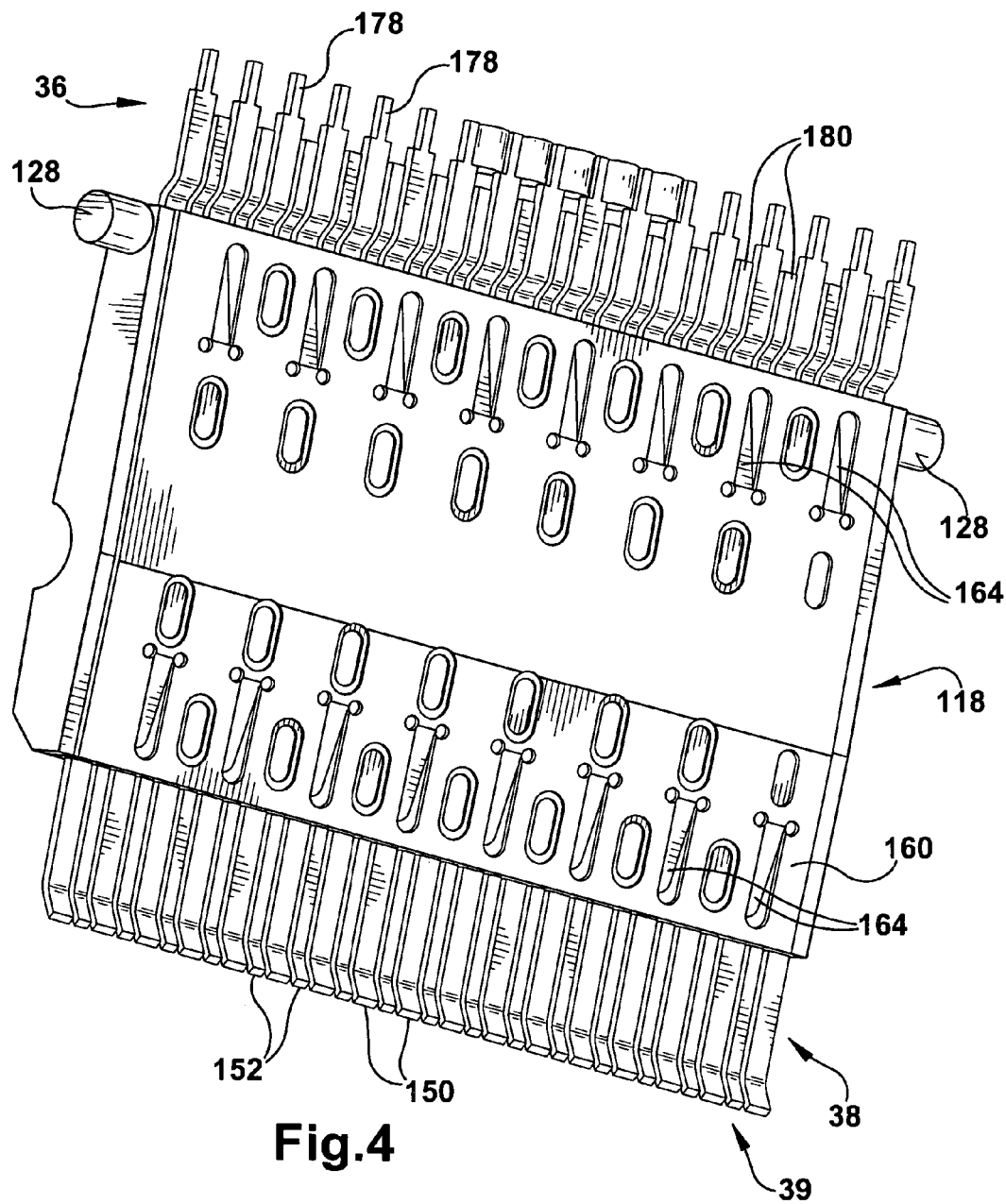
FIG. 4 is an oblique view of part of the pivotal header module of FIG. 3, showing coupling of a conductive shield.
Figure 5:
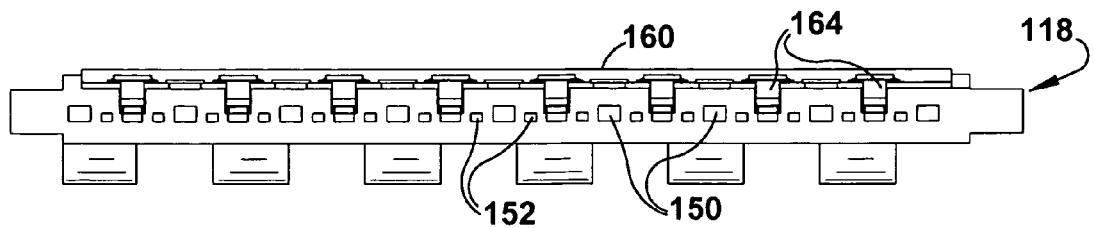
FIG. 5 is an end view of the module portion of FIG. 4.

FIGS. 4 and 5 show additional details of the arrangement of the contacts 36 within the header 118, and of conductive shielding 160 provided to the signal contacts within the header 118. It will be appreciated that the headers 120 and the contacts 36 in the arrays 39 may have substantially similar shielding, and may have a substantially similar layout to that shown in FIGS. 4 and 5. The contacts 36 of the array 37 alternate between ground contacts 150 and signal contacts 152. As best seen in FIG. 5, the ground contacts 150 may have a cross section that is both wider and taller than that of the signal contacts 152. Having the ground contacts 150 located between adjacent pairs of the signal contacts 152 aids in preventing crosstalk between the signal contacts 152. The contacts 150 are referred to herein as ground contacts, although it will be appreciated that the contacts 150 may not necessarily be grounded, but may alternatively be employed in isolating signals in the signal contacts 152, by coupling the contacts 150 to a common, preferably constant, voltage.

A planar conductive shield 160 is located on or within the plastic header 118. The header 118 may be made of any of a variety of suitable thermoplastic materials. An example of a suitable material is a moldable thermoplastic, such as liquid crystal polymer. The conductive shields 160 may be heat staked onto a portion of the header 118. The header 118 may also be at least partially overmolded onto the shield 160. The header 120 has a similar conductive shield.

The cam sliders 128 and 130 are molded extensions of the headers 118 and 120.

The contacts 36 and the conductive shield 160 are made of a suitable conductive material, such as copper alloy.

The shield 160 includes an array of tabs 164 that are bent inward toward the array 37 of contacts. The tabs 164 make contact with at least some of the ground contacts 150. The conductive shield 160 is thus electrically coupled to at least some of the ground contacts 150, and provides shielding for the signal contacts 152 of the array 37 in another direction.

Figure 6:
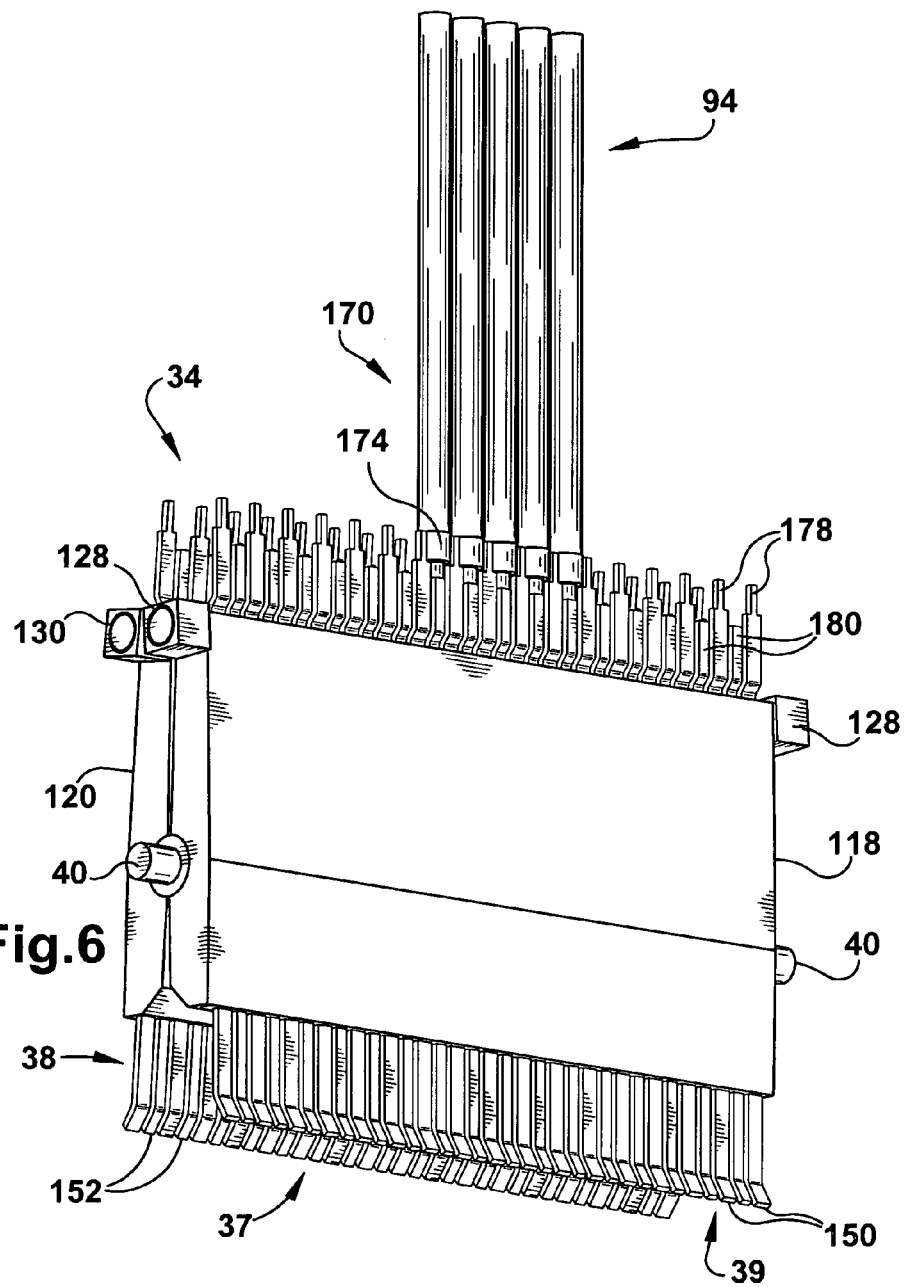
FIG. 6 is an oblique view showing a ganged ribbonized cable coupled to the pivotal header module of FIG. 3.

FIG. 6 illustrates coupling of a ganged ribbonized cable 170 to the contacts 36. The ribbonized cable 170 includes a plurality of the coaxial cables 94, mechanically coupled together by a pair of conductive ribbons 174. The conductive ribbons 174 also electrically couple together the shields of the coaxial cables 94. Coupling together of the shields of the cables 94 facilitates connection of the conductive shields of the coaxial cables 94 to the ground contacts 150 and the conductive shields 160. It will be appreciated that the coaxial cables 94 may have conductive shields consisting of a multitude of fine wires, for example, having braided or served shields, which may be difficult to directly couple to electrical contacts, such as the contacts 36. The conductive ribbons 174 are solder-coated ribbons of conductive material that may be put in place around stripped ends of the coaxial cables 94, and soldered to hold mechanically together the cables 94, and to electrically couple the conductive ribbon 174 to the braided or served shields of the coaxial cables 94. Further details regarding the conductive ribbons 174, and their coupling to the coaxial cables 94 to form the ganged ribbonized cable 170, may be found in commonly-assigned concurrently-filed U.S. Provisional Application No. 60/731,607, titled CABLE ASSEMBLY AND METHOD OF PREPARING CABLE ASSEMBLY, filed Oct. 28, 2005, which is herein incorporated by reference in its entirety.

The ground contacts 150 have narrowed end portions 178 that have a reduced width relative to the rest of the ground contacts 150. The narrowed end portions 178 extend beyond the corresponding ends of the signal contacts 152. The narrowed end portions 178 of the ground contacts 150 are welded or otherwise connected or attached to one of the conductive ribbons 174, between adjacent of the coaxial cables 94. Thus the array 37, in conjunction with the ganged ribbonized cable 170, allows for very dense and high-quality coupling of coaxial cable signal conductors and shields. The density of the coaxial cable coupling approaches that of planar coaxial cables laid adjacent to one another.

The ends 180 of the signal contacts 152 are coupled to the central signal contacts of the coaxial cables 94, which are located at the center of the coaxial cables 94. The signal contact ends 180 are welded to the central signal contacts of the coaxial cables 94.

Figure 7:
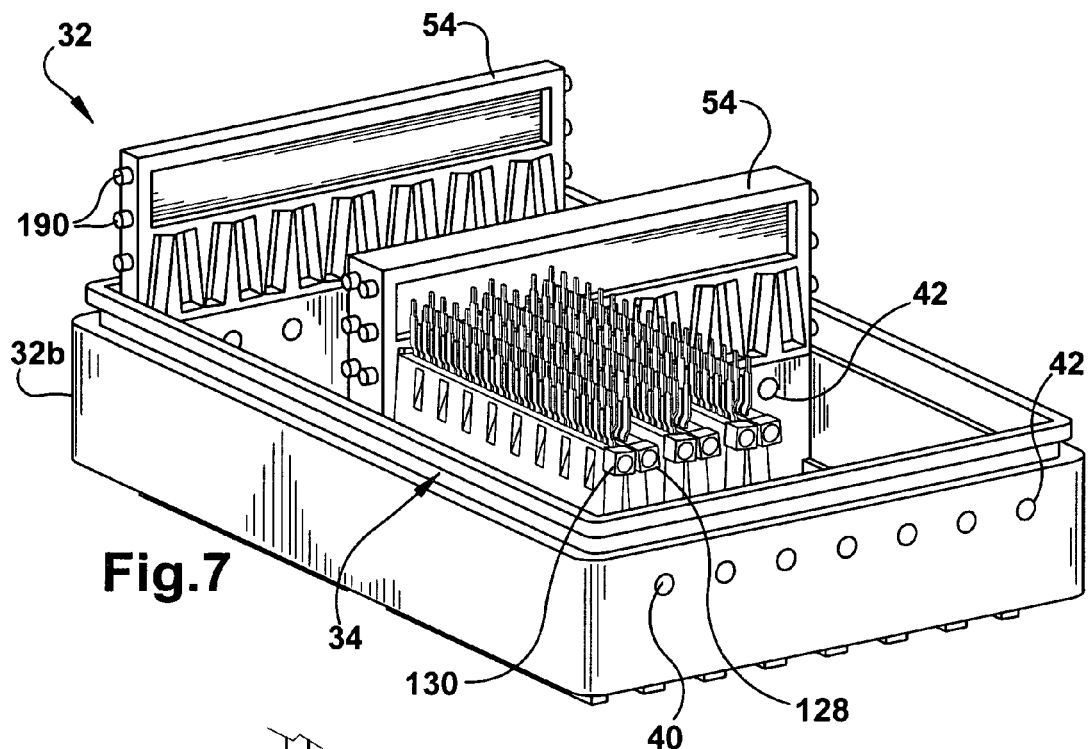
FIG. 7 an oblique view of a portion of the cable end connector of FIG. 2, illustrating the ganged array of pivotal headers.

FIG. 7 illustrates placement of the pivotal header modules 34 within the lower portion 32b of the back shell 32. The pivot pins 40 of the modules engage and are placed in pivot pin holes 42 in the lower back shell portions 32b and the ramp blocks 54. The cam sliders 128 and 130 engage the slots 60 of the ramp blocks 54 placed on either side of the modules 34. FIG. 7 also illustrates the protrusions 190 on the ramp blocks 54, which are used to heat stake the ramp blocks 54 to the rails 66 (FIG. 2).

Figure 8:
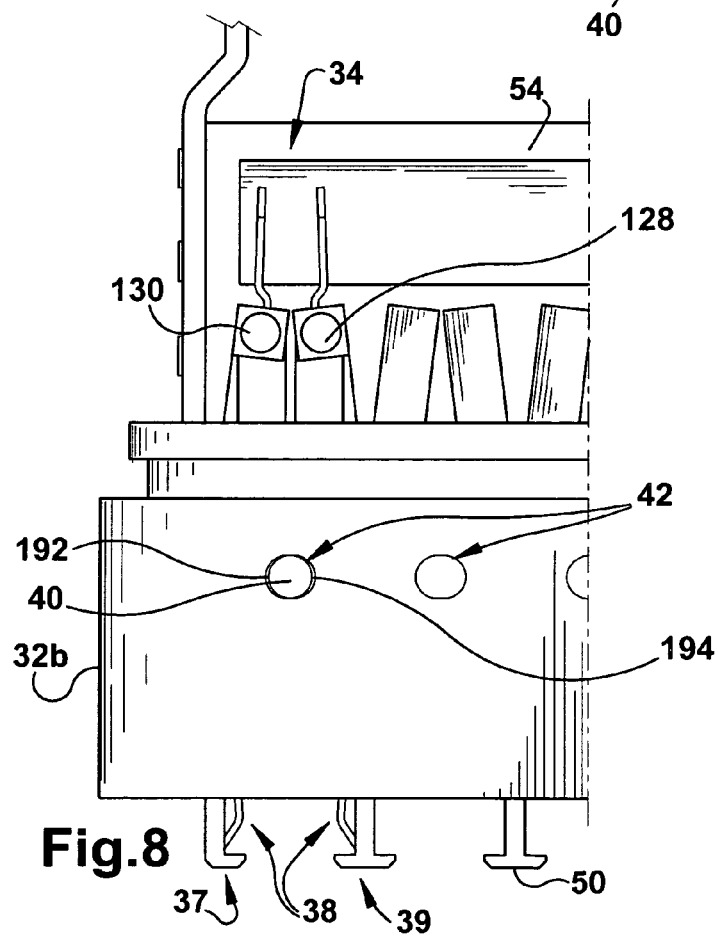
FIG. 8 is a side view of a portion of the cable end connector of FIG. 2, showing the lateral clearance between pivot pins of the pivotal modules, and the pivot pin holes.

As shown in FIG. 8, the pivot pin holes 42 may be elongate, providing lateral clearance 192 and 194 to the pivot pin 40. This use of elongate pivot pin holes 42 allows for some shifting of the positions of the pivot header modules 34 within the back shell 32, in directions perpendicular to the extent of the contact arrays 37 and 39. The lateral clearance 192 and 194 advantageously allows the modules 34 to settle within the back shell 32 in positions where there is little or no lateral force on the modules 34 from the engagement of the contacts 36 and the contacts 26 of the board mount connector 14. The lateral clearance may be about 0.005 inches.

Figure 9:
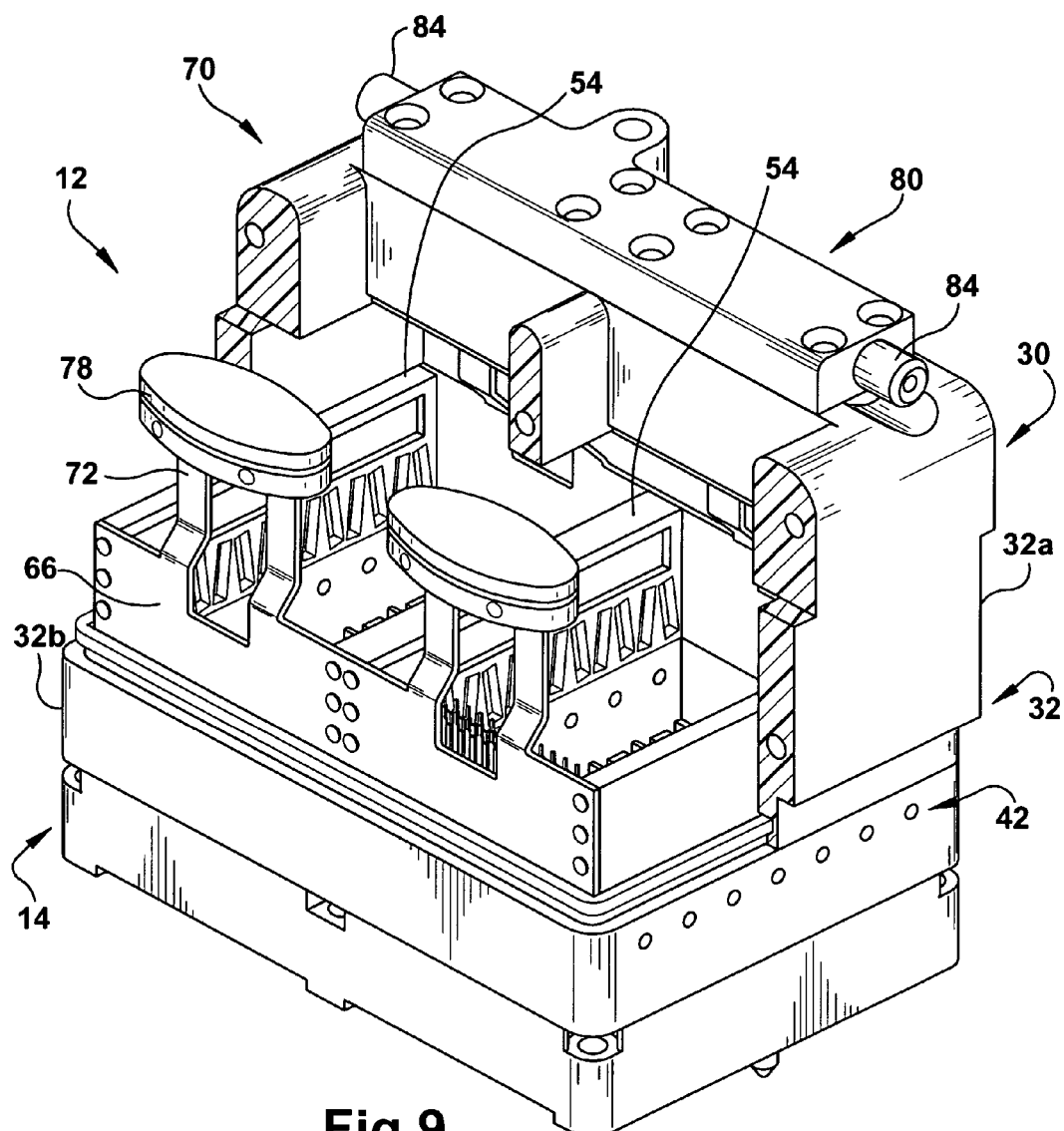
FIG. 9 is an oblique partial cutaway view showing internal detail of the cable end connector of FIG. 2.
Figure 10:
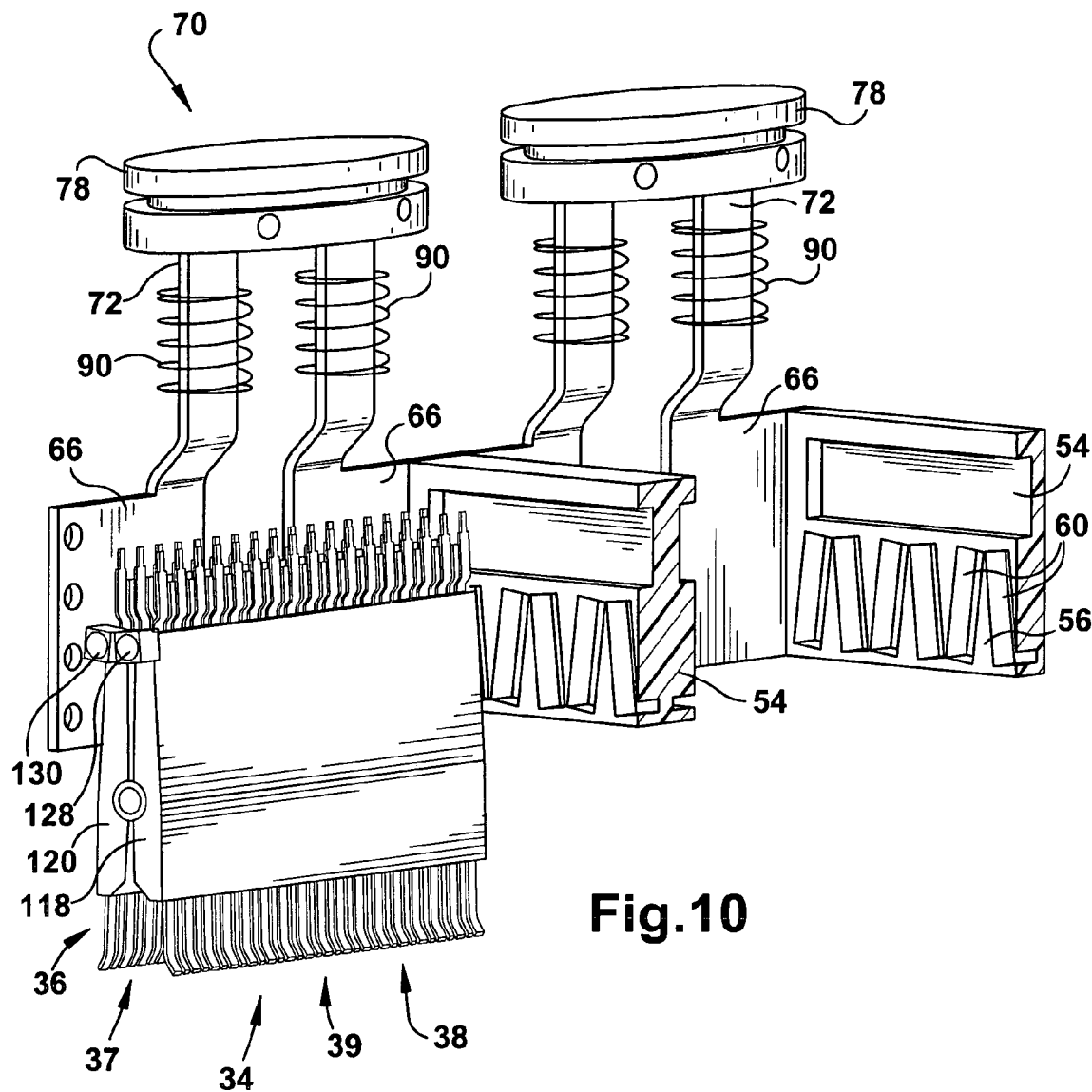
FIG. 10 is an oblique view showing various parts of the cable end connector of FIG. 2, illustrating the actuation process for pivoting the pivotal header modules.

With reference now to FIGS. 9 and 10, additional details are given of the operation of the actuating system 46. In order to couple the cable end connector 12 to the board mount connector 14 (FIG. 1), it is necessary to separate the contact ends 38 of the pair of arrays 37 and 39 from each other. This is done by applying pressurized gas through the inlets 84 of the manifolds 80. The manifolds 80 have suitable channels for communicating the pressurized gas to the oval cavities 74 (FIG. 1), at the top sides of the oval pistons 78. This gas pressure moves the oval pistons 78 within the cavities 74, moving the pistons 78 downward in opposition to a spring force from the springs 90, which urge the pistons 78 upward. The protrusions 72 of the rails 66 are attached to the oval pistons 78. For example, each of the pistons 78 may have a pair of the protrusions 72 attached to it. Moving the pistons 78 downward moves the rails 66 downward as well.

The rails 66 are in turn attached to opposite sides of a series of the ramp blocks 54. The ramp blocks 54 have pairs of the slots 60, separated by the ramps 56, for receiving the cam sliders 128 and 130 from one side of one of the modules 34. As the rails 66 move downward under the gas pressure, the ramp blocks 54 move downward as well. The cam sliders 128 and 130 of each of the pivotal header modules 34 are pushed together by the ramps 56, with the cam sliders 128 and 130 remaining in the diagonal slots 60. This causes the halves of the pivotal header modules 34 to pivot about their pivot pins 40, forcing the contact ends 38 of the array 37 apart from the ends 38 of the array 39.

Once the contact ends 38 have been retracted by separating the arrays 37 and 39 of each of the modules 34 from one another, the cable end connector 12 may be brought into engagement with the board mount connector 14 (FIG. 1). The contact guards 30 and 50 of the modules 12 and 14 protect the contacts 26 and 36 from damage during the mechanical engaging of the connectors 12 and 14.

Once the cable end connector 12 and the board mount connector 14 are engaged, the gas pressure may be released from the cavities 74. This causes the pistons 78 and the rails 66 to move upward under the action of the springs 90. This in turn moves the ramp blocks 54 upward, causing the cam sliders 128 and 130 to separate from one another as they remain in the slots 60, now separated by wide portions of the ramps 66. This brings the contact ends 38 of the contacts 36 into engagement with the board mount contacts 26 (FIG. 1). The contacts 26 and 36 are configured to maintain good contact, with balanced lateral forces. The ability of the modules to float somewhat in their positions, due to the elongated shape of the pivot pin holes 42, aids in placement of the modules 34, with minimal overall forces on the back shell 32 and other portions of the cable end connector 12, and with balanced opposed lateral contact forces.

The oval shape of the pistons 78 advantageously allows use of pistons with relatively large surface areas, in a relatively narrow space. The oval shape of the pistons 78 allows close spacing of cable assemblies, by making efficient use of the available space.

The pressurized gas actuator 70 is configured to allow use of ganged ramp blocks 54, mechanically joined together by the rails 66, and simultaneous actuation and movement of all of the ramp blocks 54. By making the actuator 70 spring biased in favor of bringing the arrays 37 and 39 of the contact ends 38 together, the contact ends 38 may be maintained engaged with the contacts 26 of the board mount connector 14 without application of external force. Thus undesirable vibrations on the system, such as from an air compressor, may be avoided while the contacts 26 and 36 are engaged. However, it will be appreciated that alternatively the system may be spring biased toward disengagement of the contact ends 38 from the contacts 26, with a force applied to achieve engagement.

Figure 11:
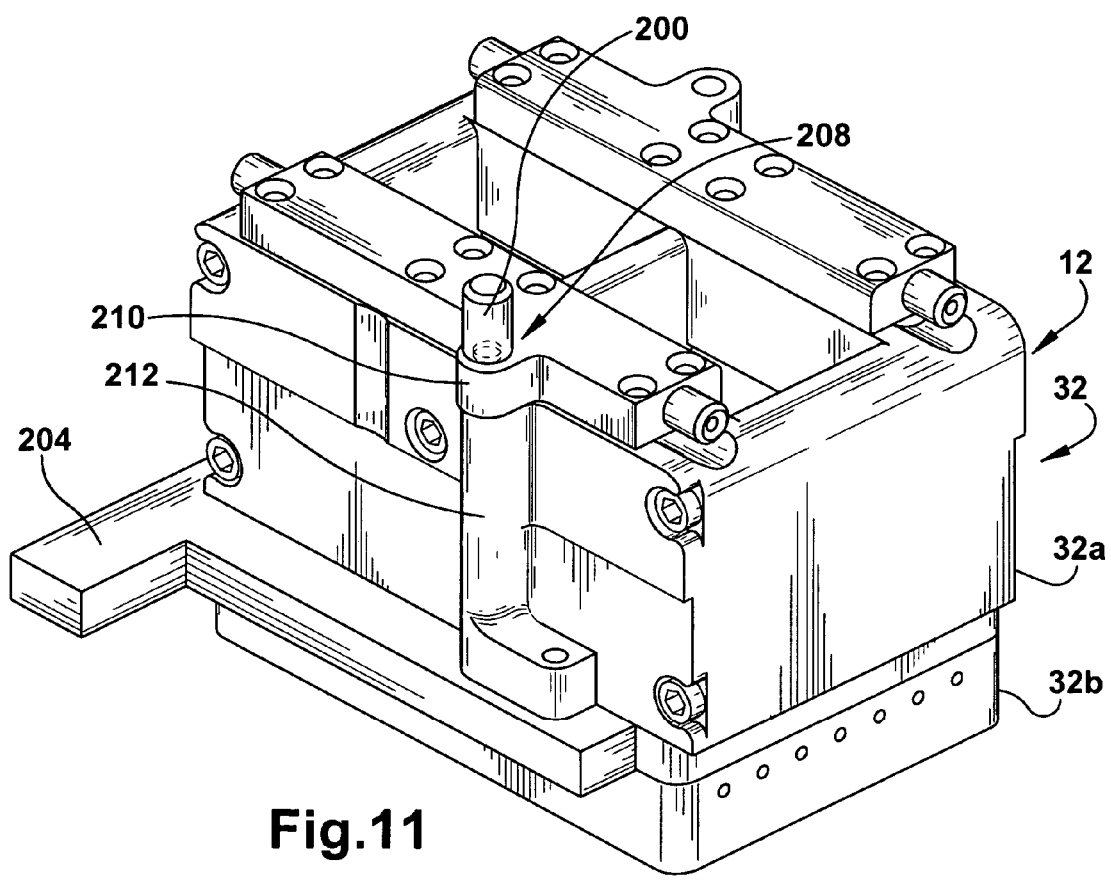
FIG. 11 is an oblique view showing mounting of the cable end connector of FIG. 2 to a mounting structure.

FIG. 11 shows another mechanism by which a mating tolerance may be obtained to facilitate mating of the cable end connector 12 and the board mount connector 14 (FIG. 1). FIG. 11 shows a shoulder screw 200 that is used to couple the cable end connector 12 to a mounting structure 204, such as a board. The mounting structure 204 may be part of a device under test (DUT) tester. The shoulder screw passes through one or more holes 208 in a manifold flange 210 and/or a back shell flange 212. Clearance in the one or more holes 208 allows some float in the positioning of the cable end connector 12 relative to the mounting structure 204. Nevertheless, the shoulder screw 200 may securely keep the cable end connector from being pulled away from the mounting structure 204. The size and shape of the holes 208 may be suitable selected to allow a desired amount of float in the positioning of the cable end connector 12 relative to the mounting structure 204. For example, the one or more holes 208 may be round holes having a larger diameter than the diameter of the portion of the shoulder screw 200 that passes through the holes. Alternatively, the holes 208 may be oval, or may have another suitable shape that allows more float in one direction than in another direction Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described elements (components, assemblies, devices, compositions, etc.), the terms (including a reference to a "means") used to describe such elements are intended to correspond, unless otherwise indicated, to any element which performs the specified function of the described element (i.e., that is functionally equivalent), even though not structurally equivalent to the disclosed structure which performs the function in the herein illustrated exemplary embodiment or embodiments of the invention. In addition, while a particular feature of the invention may have been described above with respect to only one or more of several illustrated embodiments, such feature may be combined with one or more other features of the other embodiments, as may be desired and advantageous for any given or particular application.

What is claimed is:

1. An electrical connector comprising:
   a back shell;
   a plurality of contact modules in the back shell, wherein each of the modules has a pair of headers that include respective substantially planar arrays of conductive contacts within insulating material; and
   an actuating system operatively coupled to the contact modules to cause the headers to pivot relative to one another, to thereby selectively bring together or separate contact ends of the contacts;
   wherein the headers of each of the modules each have at least one cam slider thereupon; and
   wherein the actuating system includes a plurality of ramps in contact with the cam sliders, whereby movement of the ramps causes relative pivoting of the portions of the contact modules.

2. The electrical connector of claim 1, wherein the ramps are linear ramps.

3. The electrical connector of claim 1, wherein the contacts have compliant contact ends configured to engage substantially identical mating contacts of a mating connector.

4. The electrical connector of claim 1,
   wherein the arrays of conductive contacts have alternating signal contacts and ground contacts; and
   wherein the ground contacts are thicker than the signal contacts.

5. The electrical connector of claim 1,
   wherein plural of the ramps are in each of one or more ramp blocks within the back shell; and
   wherein the cam sliders fit into slots in the ramp blocks that adjoin the ramps.

6. The electrical connector of claim 5,
   wherein the contact modules each include pins about which the headers pivot;
   wherein the pins fit into holes in at least one of the back shells and the ramp blocks; and wherein the holes are elongate holes that allow the contact modules to adjust position relative to the back shell, in a direction substantially perpendicular to planes of the contact arrays of the contact modules.

7. The electrical connector of claim 1, wherein the ramps are mechanically coupled together so that they can be substantially simultaneously moved by the actuating system.

8. The electrical connector of claim 7, wherein the actuating system includes:
pistons within cavities in the back shell, wherein the pistons are mechanically coupled to the ramps such that movement of the pistons causes a corresponding movement of the ramps; and
a manifold configured to provide compressed gas to the cavities on a top side of the pistons to move the pistons and the ramps.

9. The electrical connector of claim 8, wherein the pistons are oval pistons.

10. The electrical connector of claim 8, wherein the actuating system further includes one or more springs that oppose movement of the pistons under the action of the compressed gas.

11. The electrical connector of claim 10, wherein the one or more springs bias the modules such that the contact ends of the modules are configured to engage contacts of a mating electrical connector.

12. The electrical connector of claim 10, wherein the one or more springs bias the modules such that the contact ends of the modules are configured to disengage contacts of a mating electrical connector.

13. An electrical connector in combination with a mating connector, the combination comprising:
the electrical connector, including:
a back shell;
a plurality of contact modules in the back shell, wherein each of the modules has a pair of headers that include respective substantially planar arrays of conductive contacts within insulating material; and
an actuating system operatively coupled to the contact modules to cause the headers to pivot relative to one another, to thereby selectively bring together or separate contact ends of the contacts; and
the mating connector;
wherein the contacts have compliant contact ends configured to engage substantially identical mating contacts of the mating connector;
wherein the mating connector includes multiple mating modules bearing the mating contacts; and
wherein the mating contacts of each of the mating modules are between the contacts of respective of the contact modules, when the electrical connector and the mating connector are mated.

14. An electrical connector comprising:
a back shell;
a plurality of contact modules in the back shell, wherein each of the modules has a pair of headers that include respective substantially planar arrays of conductive contacts within insulating material; and
an actuating system operatively coupled to the contact modules to cause the headers to pivot relative to one another, to thereby selectively bring together or separate contact ends of the contacts;
wherein the arrays of conductive contacts have alternating signal contacts and ground contacts;
wherein the ground contacts are thicker than the signal contacts;
wherein each of the portions has a planar conductive shield spatially offset and substantially parallel to the array of conductive contacts; and
wherein conductive shield includes tabs that contact at least some of the ground contacts.

15. A method of coupling first and second connectors, the method comprising:
pivotally separating first contact ends of each of a plurality of first modules of the first connector;
inserting a portion of the first connector into the second connector such that second contacts of each of plural second modules of the second connector are between, but not in contact with, the first contact ends of respective of the first modules and
bringing the first contact ends of each of the first modules toward each other such that the first contact ends make contact with the second contacts of respective of the second modules;
wherein the separating includes relatively pivoting portions of the first headers by moving ramps to change the distance between cam sliders on the portions of the first modules.

16. The method of claim 15,
wherein the first contact ends and the second contacts are compliant contacts;
wherein the first contact ends are substantially identical to the second contact ends
wherein the bringing the first contact ends toward each other includes making contact at at least two points between each mating pair of the first contact ends and the second contacts.

17. The method of claim 15, wherein the separating includes using compressed gas to move oval pistons that are in cavities within a back shell of the first connector, and wherein the pistons are mechanically coupled to the ramps such that movement of the pistons moves the ramps.

18. The method of claim 17, wherein the bringing the first contact ends of toward each other includes using spring forces to move the ramps in an opposite direction from that in which the ramps are moved in the separating.

* * * * *